US009394178B2

(12) United States Patent
Bedell et al.

(10) Patent No.: US 9,394,178 B2
(45) Date of Patent: Jul. 19, 2016

(54) WAFER SCALE EPITAXIAL GRAPHENE TRANSFER

(71) Applicant: INTERNATIONAL BUSINESS MACHINES CORPORATION, Armonk, NY (US)

(72) Inventors: Stephen W. Bedell, Wappingers Falls, NY (US); Christos D. Dimitrakopoulos, Baldwin Place, NY (US); Keith E. Fogel, Hopewell Junction, NY (US); James B. Hannon, Lake Lincolndale, NY (US); Jeehwan Kim, White Plains, NY (US); Hongsik Park, Yorktown Heights, NY (US); Dirk Pfeiffer, Croton on Hudson, NY (US); Devendra K. Sadana, Pleasantville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/816,887

(22) Filed: Aug. 3, 2015

(65) Prior Publication Data

US 2015/0336800 A1 Nov. 26, 2015

Related U.S. Application Data

(63) Continuation of application No. 13/855,313, filed on Apr. 2, 2013, now Pat. No. 9,096,050.

(51) Int. Cl.
*H01L 21/027* (2006.01)
*H05K 3/04* (2006.01)

(Continued)

(52) U.S. Cl.
CPC ........... *C01B 31/0446* (2013.01); *B32B 43/006* (2013.01); *H01L 21/0272* (2013.01); *H01L 21/02378* (2013.01); *H01L 21/02527* (2013.01);

(Continued)

(58) Field of Classification Search
None
See application file for complete search history.

(56) References Cited

U.S. PATENT DOCUMENTS 8,142,754 B2 3/2012 Lanzara et al.
8,227,069 B2 7/2012 Kusunoki et al.

(Continued)

FOREIGN PATENT DOCUMENTS

CN 102206867 A 10/2011
CN 102492922 A 6/2012

(Continued)

OTHER PUBLICATIONS

Dimitrakopoulos, C., et al. "Formation of Large Scale Single Crystalline Graphene," Office Action mailed for U.S. Appl. No. 13/966,690 mailed on Jun. 19, 2014 (5 Pages).

(Continued)

*Primary Examiner* — Shamim Ahmed
*Assistant Examiner* — Bradford Gates
(74) *Attorney, Agent, or Firm* — Tutunjian & Bitetto, P.C.; Louis J. Percello

(57) ABSTRACT

A method for transfer of a two-dimensional material includes forming a spreading layer of a two-dimensional material on a substrate, the spreading layer having a monolayer. A stressor layer is formed on the spreading layer, and the stressor layer is configured to apply stress to a closest monolayer of the spreading layer. The closest monolayer is exfoliated by mechanically splitting the spreading layer wherein the closest monolayer remains on the stressor layer.

20 Claims, 5 Drawing Sheets

(51) Int. Cl.

| | |
|---|---|
| ***C01B 31/04*** | (2006.01) |
| ***B32B 43/00*** | (2006.01) |
| ***H01L 21/02*** | (2006.01) |
| ***H01L 21/683*** | (2006.01) |
| ***H01L 21/20*** | (2006.01) |
| ***H01L 29/16*** | (2006.01) |

(52) U.S. Cl.

CPC ........ *H01L 21/2007* (2013.01); *H01L 21/6835* (2013.01); *H01L 29/1606* (2013.01); *H05K 3/048* (2013.01); *H01L 2221/68345* (2013.01); *H01L 2221/68368* (2013.01); *H01L 2221/68381* (2013.01); *Y10T 156/11* (2015.01); *Y10T 156/1153* (2015.01)

(56) References Cited

U.S. PATENT DOCUMENTS

| | | | |
|---|---|---|---|
| 8,409,366 | B2 | 4/2013 | Ogihara et al. |
| 8,419,880 | B2 | 4/2013 | Cho et al. |
| 9,096,050 | B2 * | 8/2015 | Bedell ................... B32B 43/006 |
| 2009/0155561 | A1 | 6/2009 | Choi et al. |
| 2010/0021708 | A1 | 1/2010 | Kong et al. |
| 2010/0055464 | A1 | 3/2010 | Sung |
| 2010/0143726 | A1 | 6/2010 | Golzhauser et al. |
| 2010/0323164 | A1 | 12/2010 | Ogihara et al. |
| 2011/0048625 | A1 | 3/2011 | Caldwell et al. |
| 2011/0108521 | A1 | 5/2011 | Woo et al. |
| 2011/0223094 | A1 * | 9/2011 | Lanzara ................. B82Y 30/00 423/447.2 |
| 2012/0112164 | A1 | 5/2012 | Chu et al. |
| 2012/0248401 | A1 | 10/2012 | Shin et al. |
| 2012/0308468 | A1 | 12/2012 | Choi et al. |
| 2013/0065022 | A1 | 3/2013 | Seo et al. |
| 2014/0014030 | A1 | 1/2014 | Tour et al. |

FOREIGN PATENT DOCUMENTS

| | | | |
|---|---|---|---|
| CN | 102586868 | A | 7/2012 |
| CN | 102592973 | A | 7/2012 |
| CN | 102795619 | A | 11/2012 |
| CN | 102206867 | B | 12/2012 |
| JP | 2009200177 | A | 9/2009 |
| JP | 2011006265 | A | 1/2011 |
| JP | 2011009268 | A | 1/2011 |
| JP | 2012-156202 | | 8/2012 |
| KR | 20110042023 | A | 4/2011 |
| WO | WO2012067438 | A2 | 5/2012 |
| WO | WO2012141699 | A1 | 10/2012 |

OTHER PUBLICATIONS

Ley, L. "Synthesis and Characteristics of Large Area Graphene on SiC" 2010 8th International Conference on Vacuum Electron Sources Conference and Nanocarbon (IVESC). Oct. 2010. (1 Page) (Abstract only).

Starke, U., et al. "Large Area Quasi-Free Standing Monolayer Graphene on 3C-SiC(111)" Applied Physics Letters, vol. 99, Issue 8. Aug. 2011. (1 Page) (Abstract only).

Vo-Van, C., et al. "Epitaxial Graphene Prepared by Chemical Vapor Deposition on Single Crystal Thin Iridium Films on Sapphire" Applied Physics Letters, vol. 98, Issue 18. Mar. 2011. (4 Pages).

Wu, Y., et al. "Large Single Crystals of Graphene on Melted Copper Using Chemical Vapor Deposition" ACS Nano, vol. 6, No. 6. May 2012. pp. 5010-5017.

* cited by examiner

WAFER SCALE EPITAXIAL GRAPHENE TRANSFER

RELATED APPLICATION DATA

This application is a Continuation application of co-pending U.S. patent application Ser. No. 13/855,313 filed on Apr. 2, 2013, incorporated herein by reference in its entirety.

BACKGROUND

1. Technical Field

The present invention relates to semiconductor devices and fabrication, and more particularly to methods and devices for separating monolayers in a layer of graphene using a stressor layer.

2. Description of the Related Art

Microelectronics applications have been increasingly employing graphene devices due to their conductive, mechanical and other properties. Processing of graphene is often unconventional relative to traditional processing techniques and is often difficult to control and incorporate into semiconductor processing. Graphene may be obtained using many techniques. One popular technique includes micromechanical alleviation of graphite. This includes employing adhesive tape to repeatedly split graphite crystals into increasingly thinner pieces. The tape with attached optically transparent flakes is dissolved in acetone, and the flakes including monolayers were sedimented on a silicon wafer. This has been improved by dry deposition, avoiding the stage when graphene floated in a liquid. This is often referred to as a "scotch tape" or drawing method. This technique may not produce a uniform graphene film.

Another method of obtaining graphene is to heat silicon carbide (SiC) to high temperatures (>1,100° C.) under low pressures (~$10^{-6}$ Torr) to reduce it to graphene. This process produces epitaxial graphene with dimensions dependent upon the size of the SiC substrate (wafer). The face of the SiC used for graphene formation, silicon- or carbon-terminated, highly influences the thickness, mobility and carrier density of the graphene. Exfoliation and transfer of the graphene layer is often very difficult.

Another method uses the atomic structure of a metal substrate to seed the growth of the graphene (epitaxial growth). In one technique, copper foil is employed, and, at very low pressure, the growth of graphene automatically stops after a single graphene layer forms. Arbitrarily large graphene films may also be created by chemical vapor deposition (CVD) growth. Multilayer graphene will also form on copper. However, exfoliation and transfer of the graphene layer is very difficult. Another disadvantage of CVD growth on metal substrates is that the grown graphene layer is a poly-crystal.

SUMMARY

A method for transfer of a two-dimensional material includes forming a spreading layer of a two-dimensional material on a substrate, the spreading layer having a monolayer. A stressor layer is formed on the spreading layer, and the stressor layer is configured to apply stress to a closest monolayer of the spreading layer. The closest monolayer is exfoliated by mechanically splitting the spreading layer wherein the closest monolayer remains on the stressor layer.

A method for transfer of graphene includes forming a spreading layer of graphene on a silicon carbide (SiC) substrate, the spreading layer having at least one monolayer; depositing a stressor layer on the spreading layer, the stressor layer being configured to apply stress to at least a closest monolayer of the spreading layer; bonding a handle substrate to the stressor layer; splitting the spreading layer by exfoliating at least the closest monolayer from the spreading layer wherein the at least closest monolayer remains on the stressor layer; and transferring the at least closest monolayer on the stressor layer using the handle substrate.

Another method for transfer of graphene includes forming a spreading layer including a monolayer of graphene on a silicon carbide substrate by heating the substrate to a temperature greater than 1000 degrees C., wherein a buffer layer of SiC in contact with the substrate includes covalent bonds to underlying material; depositing a stressor layer on the spreading layer, the stressor layer being configured to apply stress to at least a closest monolayer of the spreading layer; bonding a handle substrate to the stressor layer; splitting the spreading layer by exfoliating at least the closest monolayer from the spreading layer wherein at least the closest monolayer remains on the stressor layer by using induced stress of the stressor layer to overcome Van der Waals forces holding at least the closet monolayer to adjacent materials; transferring at least the closest monolayer on the stressor layer using the handle substrate; and etching away the stressor layer to release at least the closest monolayer onto a second substrate for device formation.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
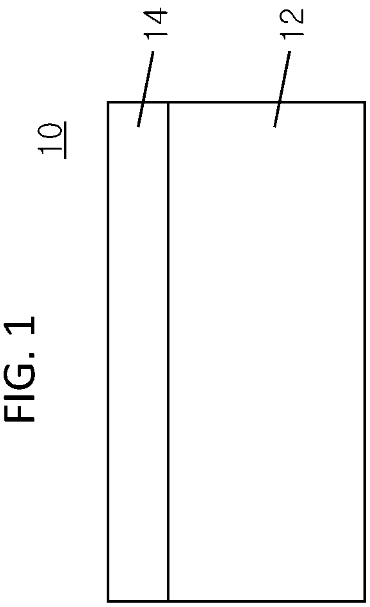
FIG. 1 is a cross-sectional view of a substrate having a spreading layer formed thereon in accordance with the present principles.

In accordance with the present principles, methods for transferring large sections of two-dimensional (2D) materials are provided. In one embodiment, a 2D material is provided on a substrate having a thickness of one or more monolayers. In one embodiment, the 2D material includes graphene and the substrate may include SiC. A stressor layer is formed on the 2D material and a handle substrate is bonded to the stressor layer. The stressor layer induces stress in at least the closest monolayer. Since the 2D material relies on weak Van der Waals forces to hold the monolayers together, the 2D material may be chemically bonded to the substrate. The stressor layer grips at least the closest monolayer, and lifting the handle substrate results in a high-quality mechanical exfoliation and lift-off of at least the closest monolayer. The top monolayer can be lifted off with little or no damage. The stressor layer may now be employed for further processing, or the exfoliated monolayer of the 2D material may be transferred to another substrate. The 2D material may be transferred on a wafer scale, which is difficult or impossible with other techniques. While wafer scale transfer is enabled, smaller sections or patterns may be transferred as well.

It is to be understood that the present invention will be described in terms of a given illustrative architecture having a substrate or flexible substrate; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Embodiments in accordance with the present principles may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw form (that is, as a single flexible substrate that has multiple structures formed thereon), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a structure 10 is illustratively shown for carrying out a lift-off process for formation of an electronic device in accordance with an exemplary embodiment. The structure 10 includes a single crystal substrate 12. In one embodiment, the single crystal substrate 12 includes Si, Ge, SiC or alloys thereof. A two-dimensional material forms a spreading or separation layer 14, which is formed on the substrate 12.

The two-dimensional (2D) material of layer 14 includes strong bonds in two dimensions and weak bonds in a third dimension. A 2D material may include weak Van der Waals forces perpendicular to a layer (weak vertical bonding) such that the material separates easily along atomic layers or strata (e.g., strength in 2D directions). Such 2D materials can be employed as interlayers to facilitate layer transfer of subsequently grown semiconductor films.

While any substrate can be employed as the base substrate 12, the base substrate 12 should be capable of offering seed locations for single crystalline deposition or formation (e.g., single crystalline graphene deposition). The 2D material of layer 14 may be deposited (epitaxially grown) on the substrate 12. The spreading layer 14 may include graphene, or other 2D materials, such as, e.g., $MoS_2$ or $WS_2$, boron nitride, mica, dichalcogenides and complex oxides.

Figure 2A:
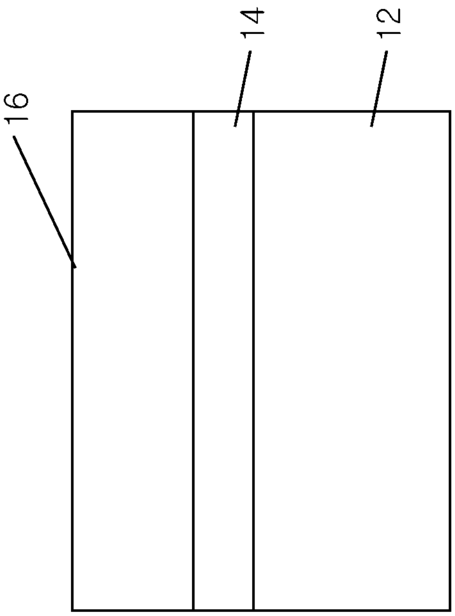
FIG. 2A is a cross-sectional view showing a stressor layer formed on the spreading layer in accordance with the present principles.

Referring to FIG. 2A, a stressor layer 16 is grown on the spreading layer 14 (e.g., graphene). The layer 16 may include a metal, an oxide, semiconductor, etc. The stressor layer 16 is configured to bond with at least a closest layer or monolayer of the 2D material of the spreading layer 14 and apply stress to the closest layer of the 2D material of the spreading layer 14. The bond strength is preferably greater between the stressor layer 16 and the monolayer 14 than the Van der Waals forces between the spreading layer 14 and the substrate 12. The spreading layer 14 may include covalent bonds with the substrate 12. It should be understood that other bonds (e.g., ionic bonds) may be formed between the substrate 12 and the spreading layer 14 depending on the material selection.

The stressor layer 16 is preferably not lattice-matched to the underlying substrate 12, although it may be. Stress may be applied based upon differences in thermal conductivities, expansion/contraction, increasing density or thickness or by other methods. A lattice-mismatch or other stress inducing mechanism is helpful in applying a stress to layer 14, which assists during exfoliation. In particularly useful embodiments, the stressor layer 16 is applied by a deposition process, such as chemical vapor deposition (CVD), physical vapor deposition (PVD) (e.g., sputtering, evaporation), etc. The stressor layer 16 may include SiGe, Aluminum oxide, Ni, etc.

Figure 2B:
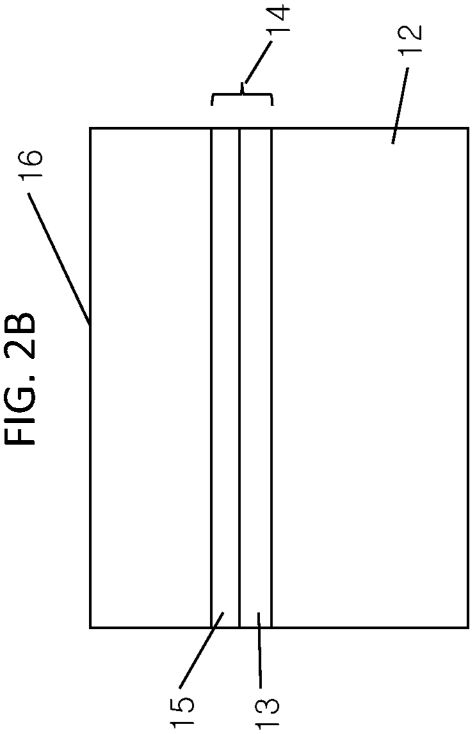
FIG. 2B is a cross-sectional view showing a stressor layer formed on a graphene spreading layer on a SiC substrate in accordance with the present principles.

Referring to FIG. 2B, in one particularly useful embodiment, the spreading layer 14 includes graphene 15 and most likely a buffer layer 13 on a SiC substrate 12. The graphene 15 is employed for and may be formed by a thermal decomposition of a face of a SiC wafer (substrate 12). Si removal from the SiC surface results in the formation of graphene at the surface of SiC. In a SiC substrate 12, below the layer of epitaxial graphene 15 on a SiC face (0001) there is always a carbon rich layer or the buffer layer 13 that is iso-structural to graphene 15 with respect to the 2D arrangement of the C atoms. The buffer layer 13 does not possess the $sp^2$ structure of graphene 15, and thus is not graphene. The buffer layer 13 is also called the 6rt3×6rt3.R30 reconstruction of the SiC surface. It is estimated that about 30-40% of the C atoms in the buffer layer 13 are covalently bonded to underlying Si atoms in the SiC substrate 12. The buffer layer 13 is insulating and does not possess any of the unique properties graphene. In accordance with the present principles, the covalent bonds can be exploited to enable monolayer (or multiple monolayer) exfoliation of the graphene 15.

In one embodiment, an epitaxial carbon monolayer deposition may be employed to form graphene 15 on the surface of the SiC substrate 12. In still other embodiments, graphene or other 2D materials may be deposited on the substrate 12 by other methods.

In another embodiment, graphene 15 is formed by heating SiC substrates to temperatures greater than 1000 degrees C. resulting in Si evaporation out from the substrate leaving one or more monolayers of single crystalline carbon (graphene). Epitaxial graphene can be grown on semi-insulating 4H- or 6H-(0001) SiC wafer surfaces within an induction-heated graphite susceptor located in an evacuatable chamber (e.g., a stainless steel vacuum chamber or quartz tube furnace) using a multistep process comprising surface preparation steps. For example, these steps may include annealing at 810° C. for 10 min and 1140° C. for 7 min under flow of 20% disilane in He, or annealing at a temperature around 1600° C. in $H_2$ gas. Then, a graphitization step is employed at 1450-1620 degrees C. under Ar flow at a chamber pressure from 3.5 mTorr to 900 mTorr for durations of 5 min to 2 hours. Other process parameters are also contemplated.

Graphene 15 is atomically smooth and when applied to the substrate 12, a small thickness is desired. In one embodiment, the thickness of the graphene spreading layer 14 is preferably one or more monolayers. In useful embodiments, the number of monolayers of graphene may be determined depending on what is needed to cleanly separate the graphene to produce a split as will be described. The present embodiments will be described in terms of a graphene monolayer structure on a SiC buffer layer 13; however, other 2D materials may be employed for the spreading layer 14 on other substrate materials.

The stressor layer 16 is grown on the graphene 15. The layer 16 may include a metal, an oxide, semiconductor, etc. The stressor layer 16 is configured to bond with the closest layer of graphene 15 and apply stress thereto. The bond strength is preferably greater between the stressor layer 16 and the graphene 15 than the Van der Waals forces between the graphene 15 and the buffer layer 13. The buffer layer 13 includes covalent bonds with the substrate 12.

The stressor layer 16 is preferably not lattice-matched to the underlying substrate 12, although it may be. Stress may be applied based upon differences in thermal conductivities, expansion/contraction, increasing density or thickness or by other methods. A lattice-mismatch or other stress inducing mechanism is helpful in applying a stress to monolayers of graphene 15, which assists during exfoliation. In particularly useful embodiments, the stressor layer 16 is applied by a deposition process, such as chemical vapor deposition (CVD), physical vapor deposition (PVD) (e.g., sputtering, evaporation), etc. The stressor layer 16 may include SiGe, Aluminum oxide, Ni, etc.

In the present example, bonding energy of graphene on SiC can be determined to be about 0.7 $J/m^2$. Typical bonding energy of graphene in graphite is about 0.3 $J/m^2$. Therefore, graphene 15 on SiC 12 is more difficult to exfoliate. For the stressor layer 16, the layer 16 should provide energy close to 0.7 $J/m^2$, and the layer 16 should be deposited with a particular thickness and stress. The greater the thickness, the more stress/strain is applied (energy) to exfoliate. The stress should start to open up cracks at the edge of interface with the graphene 15. For example, a 350 nm thick 1 GPa tensile metal film can provide ~0.7 $J/m^2$, e.g., using evaporated Ni. Therefore, a Ni film for layer 16 should be thinner than about 350 nm so that it provides strain energy just below 0.7 $J/m^2$. In this way, exfoliation can be prevented during deposition. The energy provided to exfoliate is increased with the addition of a handle substrate or tape as will be described to provide a little extra energy to exfoliate.

In one example, a sputtered Ni at 10 Torr shows stress levels of 600 MPa. One micron of sputtered Ni can provide 0.7 $J/m^2$ energy. Only 0.8 microns may be needed if additional layers, the handle substrate or tape are employed. The stress should be controlled as stress in the stressor layer 16 can crack the layer being exfoliated during the exfoliation process. Upon exfoliation, the tensile films of layer 16 shrink. During this process, the exfoliated film can be cracked because the film is stuck to the tape or handle substrate, which prevent the shrinking. Allowable stress ranges between about 500M Pa-800 MPa. Thicker films are better to avoid cracking since they are mechanically more robust. One micron or greater thickness is preferred.

Figure 3B:
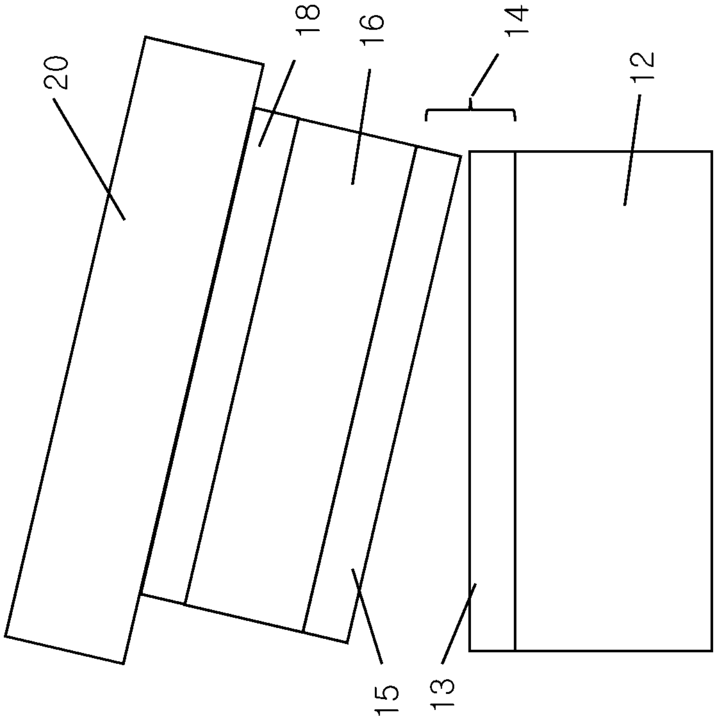
FIG. 3B is a cross-sectional view showing a handle substrate adhered to the stressor layer for handling a split off one or more monolayers of graphene from a buffer layer in accordance with the present principles.
Figure 3A:
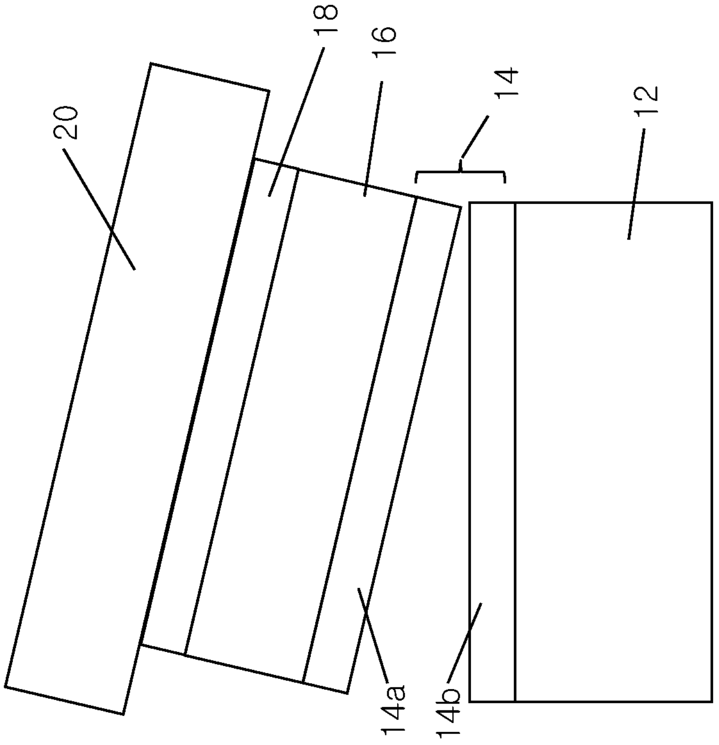
FIG. 3A is a cross-sectional view showing a handle substrate adhered to the stressor layer for handling a split off of one or more monolayers of the spreading layer in accordance with the present principles.

Referring to FIG. 3A, a handle substrate (or tape) 20 may be adhered to layer 16. Handle substrate 20 may include any suitable material and may include a crystalline substrate, a ceramic or a flexible material. The handle or flexible substrate 20 may include a polymeric material(s), such as, e.g., thermoplastics, e.g., polyethylene terephthalate (PET), polyimide, etc.; reinforced epoxy resins, such as e.g., prepreg boards, etc. The flexible substrate 20 may be glued or otherwise adhered by an adhesive or adhering layer 18 to the stressor layer 16. In other embodiments, additional layers may be employed between the flexible substrate 20 and the layer 16.

Next, a cleaving process is employed to split or spread the spreading layer 14 to divide the monolayer or monolayers. Depending on the energies and the bonding, the spreading layer 14 may be split to provide one or more monolayers 14*a* of the spreading layer 14 on the stressor layer 16 and zero or more monolayers 14*b* of the spreading layer 14 on the substrate 12. If the spreading layer 14 is covalently bonded to the single crystal substrate 12, a portion 14*b* remains in place on the substrate 12 during the splitting process, although is some embodiments no portion of the spreading layer remains on the substrate 12. The single crystal substrate 12 is reusable for other steps or for growing additional layers for other devices.

The cleaving process includes a layer splitting by mechanical force (e.g., spalling, smart-cut, etc.). In this way, layer 16 can be lifted off from substrate 12 having monolayer(s) 14*a* attached thereto. The monolayer 14*a* may be wafer-sized, meaning the exfoliation can be performed over the entire wafer in a single process. By applying stress, spreading layer 14 is split leaving one or more monolayers 14*a* of material (graphene) in contact with the layer 16.

Referring to FIG. 3B, the handle substrate 20 may be adhered to layer 16, as before. The cleaving process is employed to split or spread the spreading layer 14 to divide the monolayer or monolayers. Since buffer layer 13 is bonded to the single crystal substrate 12, this portion may remain in place on the substrate 12 during the splitting process. However, all, some or none of the buffer layer 13 may be removed with the graphene 15. The single crystal substrate 12 is reusable for other steps or for growing additional layers for other devices.

The cleaving process includes a layer splitting by mechanical force (e.g., spalling, smart-cut, etc.). In this way, layer 16 can be lifted off from substrate 12 having monolayer(s) of graphene 15 attached thereto. The monolayer 15 may be wafer-sized, meaning the exfoliation can be performed over the entire wafer in a single process. By applying stress, spreading layer 14 is split leaving one or more monolayers of material (graphene 15) in contact with the layer 16.

Figure 4:
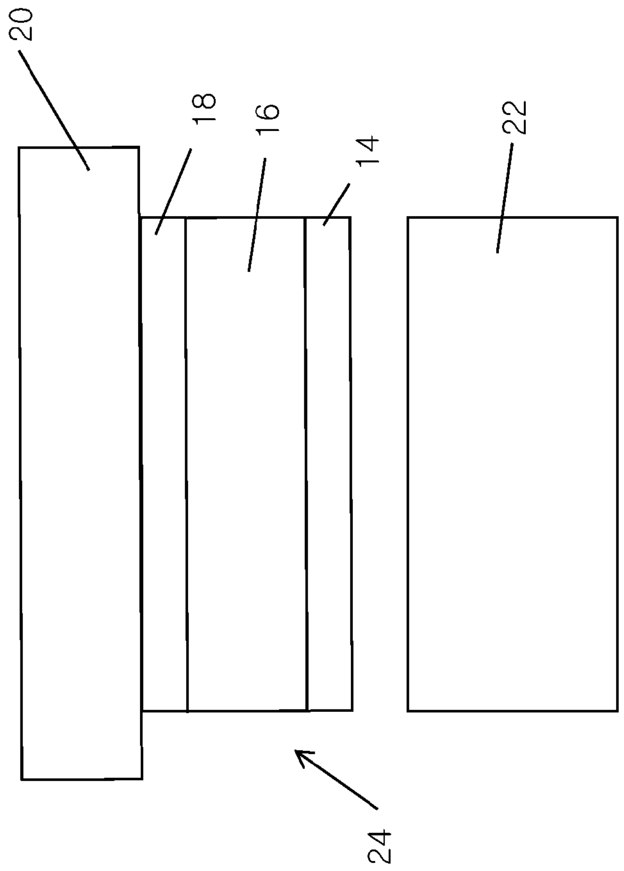
FIG. 4 is a cross-sectional view of the handle substrate over a second substrate in which the monolayer will be transferred in accordance with the present principles.

Referring to FIG. 4, a device stack 24 may be employed to fabricate devices or may be employed to transfer the monolayer or monolayers (14*a*, 15) of the spreading layer 14 (hereinafter called monolayer 14 for ease of reference) to another wafer or substrate 22. Monolayer 14 may include the entire spreading layer 14, a portion of the spreading layer 14*a*, graphene layer 15 or graphene layer 15 and none, all or part of the buffer layer 13. In one embodiment, the monolayer 14 is brought into contact with the substrate 22 and bonded or adhered to the substrate 22. It should be understood that the substrate 22 is depicted as a single layer, but may include multiple layers. The handle substrate 20 is then removed by removing the adhering layer 18, or the stressor layer 16 is removed, e.g., by selective etching or other process. In one embodiment, the flexible substrate 20 may be mounted permanently or temporarily on or with the additional substrate 22.

Figure 5:
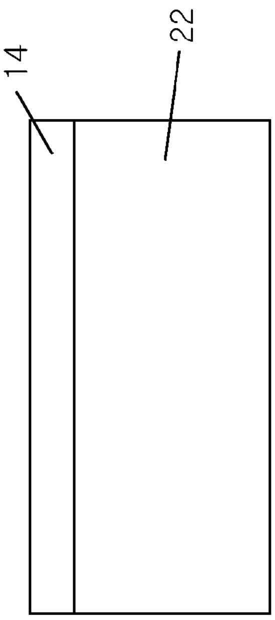
FIG. 5 is a cross-sectional view of the second substrate with the monolayer formed thereon in accordance with the present principles.

Referring to FIG. 5, the monolayer 14 is shown over the substrate 22. The monolayer 14 can extend over the entire chip or wafer. Processing may continue and employ the nature of the monolayer 14 formed in accordance with the present principles. The monolayer 14 may be employed to form transistor devices, capacitors, electric wires, photosensitive devices, biosensors, wrap-around multi-channel transistors, etc. It should be understood that parts of the monolayer 14 may be etched away to create nanostructures (e.g., ribbons, wires, dots, etc.). In this way, nanostructures may be employed locally to form devices in isolation of other devices. The monolayer 14 is defect-free or has negligible defects as shown with respect to FIG. 6.

It should be noted that if the stress of the stressor layer 16 is too small, Monolayer 14 (e.g., graphene) will not stick to substrate 22. Therefore a sufficient amount of stress is needed to aid in releasing the monolayer 14. Also, since graphene wants to shrink, if the stressor layer 16 has a stress level that is too low, the monolayer (graphene 15) and/stressor layer 16 will bend after removing the tape of handle substrate 20. Therefore, stress in the stressor layer 16 should be maintained to a value of greater than about 500 MPa.

Figure 6:
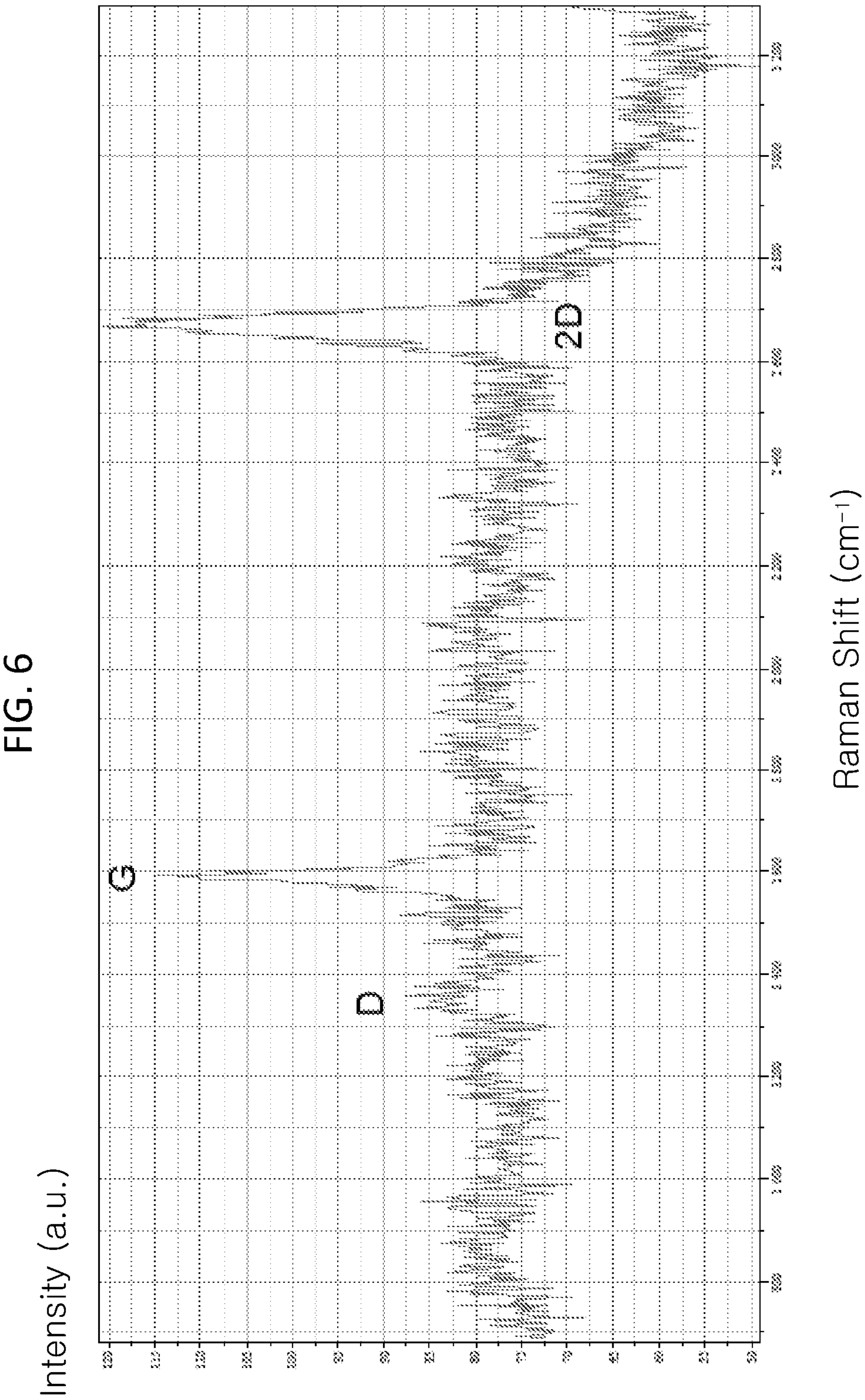
FIG. 6 is a graph showing a Raman spectrum of intensity (arbitrary units) versus Raman shift ($cm^{-1}$) showing a high quality monolayer had been transferred in accordance with the present principles.

Referring to FIG. 6, Raman spectrometer data is shown for a transferred monolayer 14 formed of graphene. The intensity in arbitrary units (a.u.) is plotted versus Raman shift ($cm^{-1}$). Three points of interest are depicted in the graph and labeled G, D and 2D. To determine if a monolayer is achieved Intensity at the G peak should be less than the Intensity at the 2D peak for graphene. This is the case in FIG. 6. Therefore, a monolayer is most likely present. Defects are present in the monolayer if a significant peak exists at D (about 1350 $cm^{-1}$). Since no significant peak exists at D the monolayer is of good quality.

Figure 7:
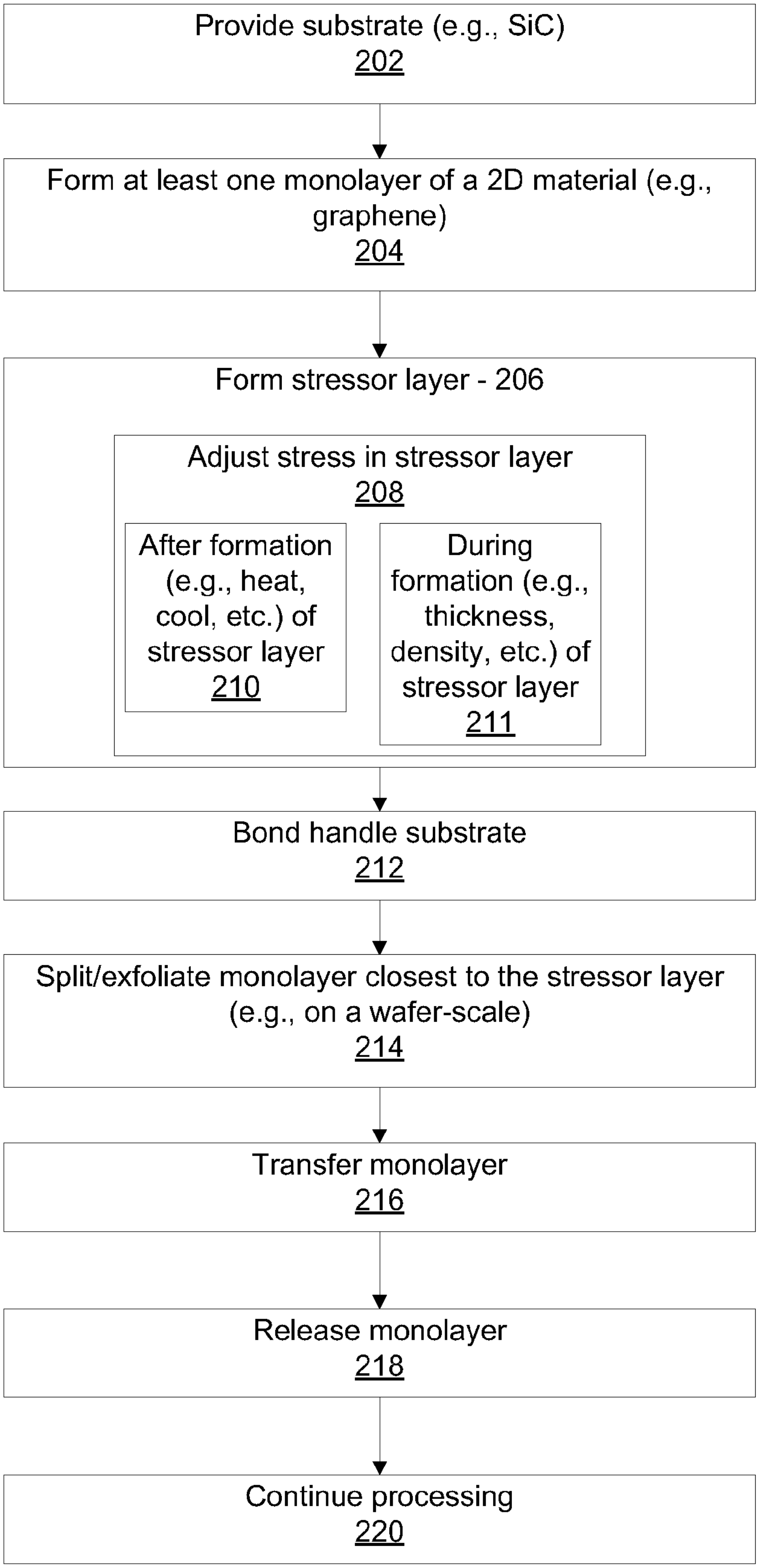
FIG. 7 is a block/flow diagram showing methods for transfer of a monolayer in accordance with illustrative embodiments.

Referring to FIG. 7, methods for obtaining and transferring a monolayer are illustratively shown in accordance with exemplary embodiments. It should be noted that, in some alternative implementations, the functions noted in the blocks may occur out of the order noted in the figure(s). For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In block 202, a substrate is provided for the formation of a 2D material thereon. In one embodiment, the substrate includes a silicon carbide substrate, although other materials may be employed. In block 204, a spreading layer is formed on the substrate including at least one monolayer. The monolayer(s) may include any 2D material, but in accordance with particularly useful embodiments the 2D material includes graphene. In one embodiment, a monolayer of graphene is formed on a buffer layer in contact with the substrate. The buffer layer may include covalent bonds to the material in the substrate. Although the monolayer(s) may be formed by any number of processes, when SiC is employed for the substrate, graphene may be formed by heating the substrate to a temperature greater than 1000 degrees C. to drive off the Si.

In block 206, a stressor layer is formed on the spreading layer. The stressor layer is configured to apply stress to a closest monolayer of the spreading layer. Stress may be provided as the stress layer is formed or may be applied after it has been formed. For example, in block 208, stress in the stressor layer may be adjusted. The adjustment may be performed after the formation of the stressor layer in block 210. This may include heating, cooling, etc. the stressor layer prior to splitting the spreading layer. In block 211, stress in the stressor layer may be adjusted during its formation by adjusting thickness, density, etc. The stressor layer may be a deposited metal, an oxide, a semiconductor, etc. to induce stress in the closest monolayer of the spreading layer.

In block 212, a handle substrate (or tape) may be bonded (e.g., glued, adhered, etc.) to the stressor layer to enable handling of the stressor layer and the monolayer once split from the spreading layer. In block 214, the spreading layer is split by exfoliating at least the closest monolayer or monolayers to the stressor layer from the spreading layer wherein the closest monolayer remains on the stressor layer by using induced stress of the stressor layer to overcome Van der Waals forces holding the closet monolayers to the spreading layer. The closest monolayers may be exfoliated on a wafer scale or on a smaller scale if desired.

In block 216, the monolayer(s) on the stressor layer is transferred using the handle substrate. The monolayer may be placed on a surface, on a device, or on another substrate. In block 218, the stressor layer is etched or otherwise processed to release the closest monolayer or monolayers onto a surface, a device or a second substrate for device formation or other uses. Processing may continue in block 220 to form devices or otherwise employed the transferred monolayer.

Having described preferred embodiments for wafer scale epitaxial graphene transfer (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for transfer of a two-dimensional material, comprising:

Forming a stressor layer on a spreading layer, the spreading layer comprising a two-dimensional material having at least one monolayer on a first substrate;

propagating a crack along a monolayer interface of the spreading layer to split the spreading layer into portions along the crack to exfoliate at least a closest monolayer, wherein the at least closest monolayer remains on the stressor layer;

transferring the at least closest monolayer on the stressor layer; and etching away the stressor layer to release the at least closest monolayer onto a second substrate.

2. The method as recited in claim 1, wherein the first substrate includes SiC and the spreading layer includes graphene, and wherein forming the spreading layer includes heating the SiC substrate to a temperature greater than 1000 degrees C.

3. The method as recited in claim 1, wherein forming the stressor layer includes depositing one of a metal, an oxide and a semiconductor to induce stress in the at least closest monolayer of the spreading layer.

4. The method as recited in claim 1, wherein the stressor layer is configured to apply stress to the at least closest monolayer of the spreading layer.

5. The method as recited in claim 4, wherein exfoliating the at least closest monolayer includes lifting off the at least closest monolayer by using induced stress of the stressor layer to overcome Van der Waals forces holding the closet monolayers to adjacent material.

6. The method as recited in claim 1, further comprising bonding a handle substrate to the stressor layer to affect the step of exfoliating.

7. The method as recited in claim 1, wherein the at least closest monolayer is exfoliated on a wafer scale.

8. The method as recited in claim 4, further comprising adjusting stress in the stressor layer during or after its formation.

9. The method as recited in claim 8, wherein adjusting stress in the stressor layer includes one of heating, cooling, thickening or densifying the stressor layer prior to splitting the spreading layer.

10. The method of claim 1, wherein splitting the spreading layer into portions includes mechanical splitting.

11. A method for transfer of graphene, comprising:

forming a stressor layer on a spreading layer, the spreading layer having at least one monolayer of graphene on a SiC substrate;

propagating a crack along a monolayer interface of the spreading layer to split the spreading layer into portions along the crack to exfoliate at least a closest monolayer from the spreading layer, wherein the at least closest monolayer remains on the stressor layer;

transferring the at least closest monolayer on the stressor layer; and etching away the stressor layer to release the at least closest monolayer onto a second substrate.

12. The method as recited in claim 11, wherein forming the spreading layer includes heating the SiC substrate to a temperature greater than 1000 degrees C.

13. The method as recited in claim 11, wherein forming the stressor layer includes depositing one of a metal, an oxide and a semiconductor to induce stress in the at least closest monolayer of the spreading layer.

14. The method as recited in claim 11, wherein the stressor layer is configured to apply stress to the at least closest monolayer of the spreading layer.

15. The method as recited in claim 14, wherein splitting includes lifting off the at least closest monolayer by using induced stress of the stressor layer to overcome Van der Waals forces holding the at least closet monolayer to adjacent material.

16. The method as recited in claim 11, wherein the at least closest monolayer is exfoliated on a wafer scale.

17. The method as recited in claim 14, further comprising adjusting stress in the stressor layer during or after its formation.

18. The method as recited in claim 17, wherein adjusting stress in the stressor layer includes one of heating, cooling, thickening or densifying the stressor layer prior to splitting the spreading layer.

19. The method as recited in claim 11, further comprising bonding a handle substrate to the stressor layer to affect the step of exfoliating.

20. The method as recited in claim 19, wherein transferring the at least closest monolayer on the stressor layer includes using the handle substrate.

* * * * *